United States Patent [19]

Kaifler

[11] Patent Number: 5,040,040
[45] Date of Patent: Aug. 13, 1991

[54] LIGHT-CONTROLLED SEMICONDUCTOR COMPONENT HAVING A FIELD EFFECT TRANSISTOR

[75] Inventor: Erich Kaifler, Taufkirchen, Fed. Rep. of Germany

[73] Assignee: Siemens Aktiengesellschaft, Munich, Fed. Rep. of Germany

[21] Appl. No.: 564,383

[22] Filed: Aug. 8, 1990

[30] Foreign Application Priority Data

Aug. 8, 1989 [DE] Fed. Rep. of Germany ....... 3926200

[51] Int. Cl.$^5$ .................. H01L 31/10; H01L 27/14
[52] U.S. Cl. .......................................... 357/30; 357/17; 357/19; 357/32; 357/35; 357/48
[58] Field of Search ................ 357/19, 17, 34, 30, 357/32, 35, 48; 307/311

[56] References Cited

U.S. PATENT DOCUMENTS

| 4,815,082 | 3/1989 | Isshiki et al. | 357/17 |
| 4,833,511 | 5/1989 | Sugimoto | 357/17 |
| 4,847,665 | 7/1989 | Mand | 357/19 |
| 4,879,250 | 11/1989 | Chan | 357/17 |
| 4,888,627 | 12/1989 | Pattanayak et al. | 357/30 I |
| 4,902,901 | 2/1990 | Pernyeszi | 307/311 |
| 4,916,512 | 4/1990 | Ohmi et al. | 357/34 |

FOREIGN PATENT DOCUMENTS

21086A1 1/1981 European Pat. Off. .
21086B1 5/1983 European Pat. Off. .

OTHER PUBLICATIONS

Publication Electronics Letters–Article, vol. 22, No. 12, 6/5/1986, pp. 677 to 679, "Gigahertz Voltage-Controlled Ring Oscillator".

Primary Examiner—Andrew J. James
Assistant Examiner—Daniel N. Russell
Attorney, Agent, or Firm—Herbert L. Lerner; Laurence A. Greenberg

[57] ABSTRACT

A light-controllable semiconductor component includes a semiconductor body with an upper surface. A first zone of a first conductivity type is conterminous with the upper surface of the semiconductor body. A zone of a second conductivity type is embedded in the first zone and forms a gate zone of an enhancement FET. A zone of the first conductivity type is embedded in the gate zone of the enhancement FET and forms a source zone of the enhancement FET. A zone of the second conductivity type is embedded in the first zone and forms a light-sensitive region of a photosemiconductor component. The enhancement FET has a gate electrode electrically connected to the light-sensitive region. A further zone of the second conductivity type is embedded in the first zone. A depletion FET has a source zone, a drain zone and a gate zone embedded in the further zone. The depletion FET has a gate electrode electrically connected with the source zone of the depletion FET and with the source zone of the enhancement FET. The first zone forms a drain zone of the enhancement FET. A drain terminal is electrically connected to the drain zone of the enhancement FET and contacts the drain zone below the upper surface of the semiconductor body.

6 Claims, 2 Drawing Sheets

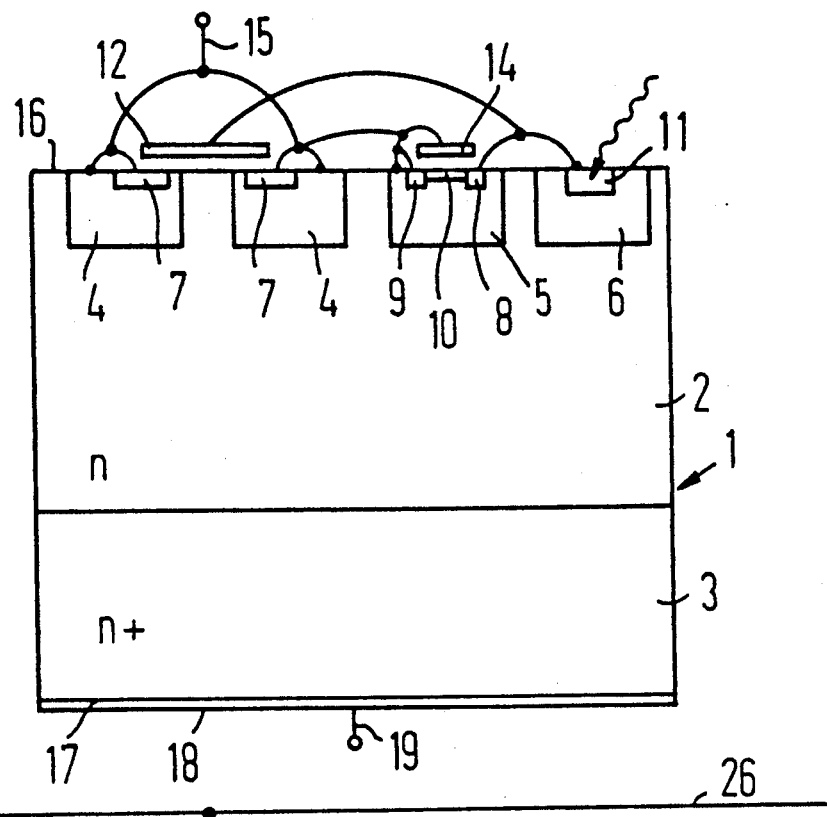
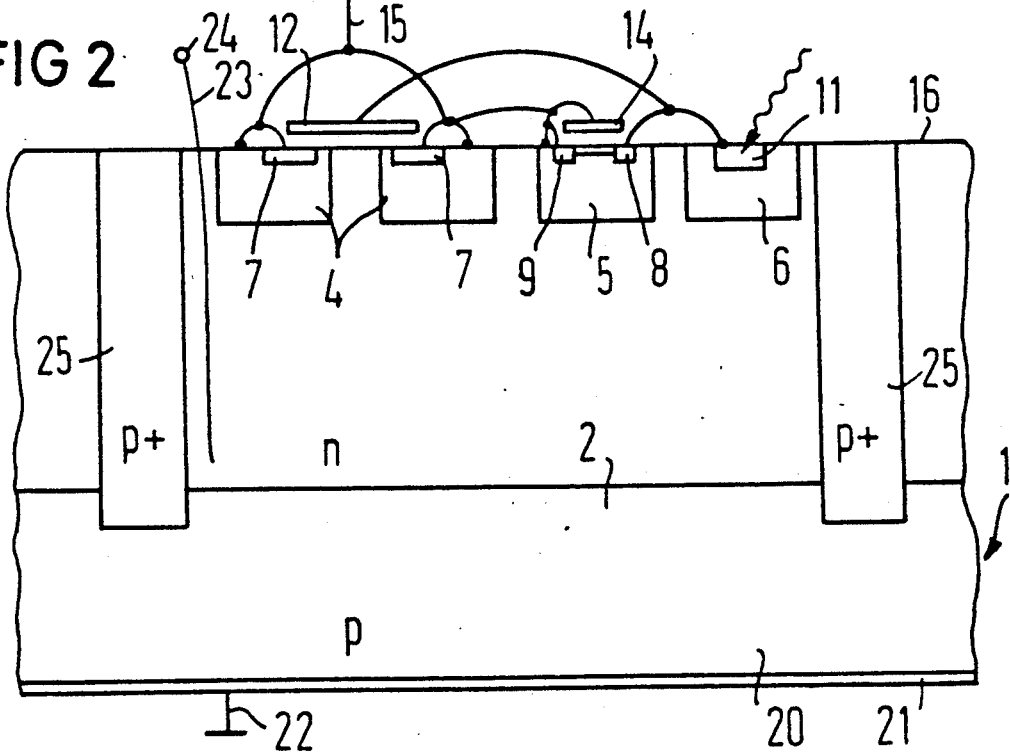

LIGHT-CONTROLLED SEMICONDUCTOR COMPONENT HAVING A FIELD EFFECT TRANSISTOR

The invention relates to a light-controllable semiconductor component having a semiconductor body with a field effect transistor.

BACKGROUND AND PRIOR ART

A light-controllable semiconductor component having light-controllable characteristics is described, for example, in German Published, Non-Prosecuted Application DE-OS 29 22 301, corresponding to European Patent No. 0 021 086. Essentially, it includes a phototransistor and a lateral FET. If light strikes the phototransistor, the gate-to-source capacitor of the FET is charged, and the FET is made conducting. If the illumination ceases, the aforementioned capacitor is discharged through a parallel resistor, and the FET is blocked. Due to the lateral FET, the semiconductor component is no longer suitable for voltages on the order of magnitude of more than 100 V.

It is accordingly an object of the invention to provide a light-controllable semiconductor component having a field effect transistor, which overcomes the hereinafore-mentioned disadvantages of the heretofore-known devices of this general type and to do so in such a way that it can be used for higher voltages as well, while occupying less space.

SUMMARY OF THE INVENTION

The semiconductor component has the following characteristics:
(a) a first zone of a first conductivity type is conterminous with the upper surface of the semiconductor body;
(b) a zone of a second conductivity type that forms the gate zone of an enhancement field effect transistor (FET) is embedded in the first zone;
(c) a zone of the first conductivity type that forms the source zone of the enhancement FET is embedded in the gate zone of the enhancement FET;
(d) a zone of the second conductivity type that forms the light-sensitive region of a photosemiconductor component is embedded in the first zone; and
(e) the light-sensitive region is electrically connected to the gate electrode of the enhancement FET.

With the foregoing and other objects in view of the above there is provided, in accordance with the invention, a light-controllable semiconductor component, comprising a semiconductor body with an upper surface; one zone of a first conductivity type conterminous with the upper surface of the semiconductor body; a zone of a second conductivity type being embedded in the one zone and forming a gate zone of an enhancement FET; a zone of the first conductivity type being embedded in the gate zone of the enhancement FET and forming a source zone of the enhancement FET; a zone of the second conductivity type being embedded in the first zone and forming a light-sensitive region of a photosemiconductor component; the enhancement FET having a gate electrode electrically connected to the light-sensitive region; a further zone of the second conductivity type being embedded in the first zone; a depletion FET having a source zone, a drain zone and a gate zone embedded in the further zone; the depletion FET having a gate electrode electrically connected with the source zone of the depletion FET and with the source zone of the enhancement FET; the first zone forming a drain zone of the enhancement FET; and a drain terminal being electrically connected to the drain zone of the enhancement FET and contacting the drain zone below the upper surface of the semiconductor body.

In accordance with another feature of the invention, there is provided at least one other one zone, at least first other vertical enhancement FET, at least one other depletion FET, and at least one other photosemiconductor element, a plurality the first zones being disposed in the semiconductor body in the form of mutually parallel strips, units each including one vertical enhancement FET, one depletion FET and one photosemiconductor element being disposed in matrix-like form in the first zones, row lines, and column lines, the source terminals of all of the vertical enhancement FETs being disposed in a row and each being connected with a respective first of the row lines, and the one zones each being connected with a respective one of the column lines.

In accordance with a further feature of the invention, there is provided a substrate having a conductivity type opposite that of the first zone and being connected to a fixed potential, the first zones being disposed on the substrate.

In accordance with an added feature of the invention, there are provided regions having a conductivity type opposite that of the first zone separating the first zones from each another.

In accordance with an additional feature of the invention, the photosemiconductor component is a photodiode.

In accordance with a concomitant feature of the invention, the photosemiconductor component is a phototransistor.

Other features which are considered as characteristic for the invention are set forth in the appended claims.

Although the invention is illustrated and described herein as embodied in a light-controllable semiconductor component having a field effect transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic sectional view single semiconductor component according to the invention;

FIG. 2 is a frammentary sectional view of a photoelectric array with semiconductor components according to the invention;

DESCRIPTION OF THE PREFERRED EMBODIMENTS

Figure 3:
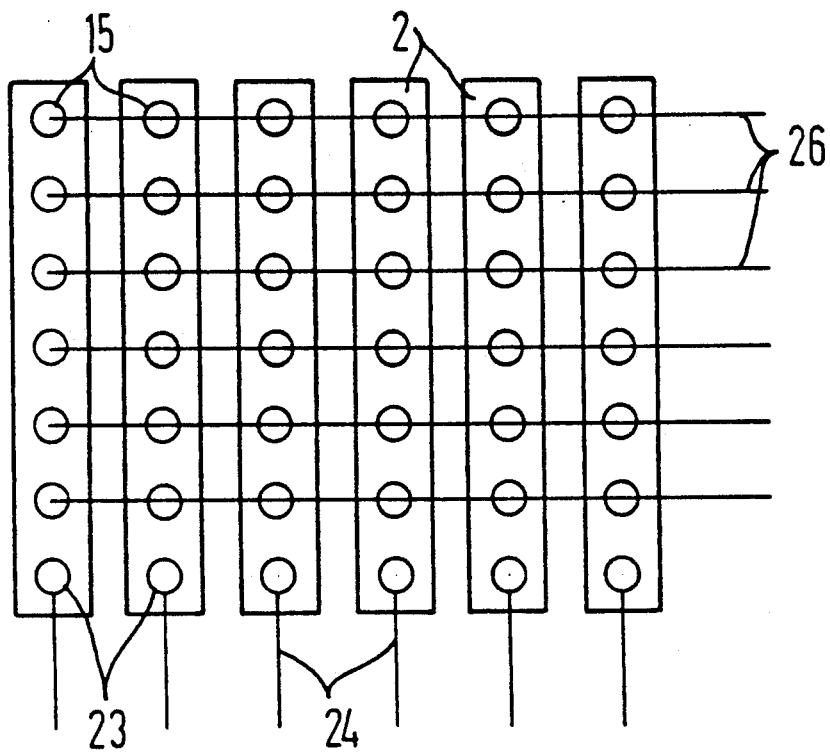
FIG. 3 is a plan view of the photoelectric array of FIG. 2.

Referring now to the figures of the drawings in detail and first, particularly, to FIG. 1 thereof, there is seen a light-controllable semiconductor component having a semiconductor body 1 with a first zone 2 that is conterminous with an upper surface 16 of the semiconductor body 1. The first zone 2 has n-type doping, for example. Bordering on the lower surface of the zone 2 is a substrate 3, which has higher doping than the first zone 2. A zone 4 is embedded in the first zone 2 at the upper surface 16 of the semiconductor body 1. The zone 4 forms the gate zone of an enhancement FET. Embedded in the zone 4 is a zone 7 of a first conductivity type, which forms the source zone of the enhancement FET. The source zone 7 is electrically connected to the gate zone 4. The drain zone of the vertical enhancement FET is formed by the first zone 2.

Spaced laterally apart from the gate zone 4 is a further zone 5 of a second conductivity type which is embedded in the first zone 2. A drain zone 8, a source zone 9 and a gate zone 10 are embedded in the zone 5. The zones 8, 9 and 10 form a lateral depletion FET. A zone 6 of the second conductivity type, which forms the anode zone of a light-sensitive diode, is also embedded in the first zone 2, bordering the upper surface 16. The enhancement FET is provided with a gate electrode 12, and the depletion FET is provided with a gate electrode 14.

The anode zone 6 of the light-sensitive diode is connected to the drain zone 8 of the depletion FET and to the gate electrode 12 of the enhancement FET. The gate electrode 14 is connected on one hand to the source zone 9 of the depletion FET and on the other to the source zone 7 of the enhancement FET. The source zone 9 of the depletion FET is also connected to the gate zone 10 of the depletion FET. The source zone 7 of the enhancement FET has a source terminal 15.

Instead of the photodiode, an integrated phototransistor may be used. To this end, a zone 11 of the first conductivity type, which forms the emitter zone of the phototransistor, is embedded in the zone 6. In this case, the zone 6 is the base zone thereof.

A lower surface 17 of the semiconductor body 1 is provided with a drain electrode 18, which contacts the substrate 3. The drain electrode 18 has a drain terminal 19.

In order to explain the mode of operation of the light-controllable semiconductor component, it is assumed that a negative potential relative to the drain terminal 19 is present at the source terminal 15, and that light is striking the photodiode 2, 6. A photoelectric current then flows from the zone 6 to the gate electrode 12 of the enhancement FET and makes it conducting, provided that its cutoff voltage is attained. Then a current flows out of the source zone 7 into the drain zone 2 to the drain terminal 19. A small portion of the photoelectric current also flows away through the source-to-drain path of the depletion FET to the source terminal 15. However, this portion of the current can be kept quite low because a depletion FET which has its gate electrode connected to its source terminal acts in a known manner as a current limiter.

With this configuration of integrated components, a vertical enhancement FET can be switched on in a simple manner by means of light. The vertical FET can be dimensioned for high off-state voltages, on the order of magnitude of several hundred volts. This is essentially attained by selecting how the zones 2 and 4 are doped, by how thick the zones 2 are, and how the zones 4 are constructed geometrically, taking care to avoid sharp edges. However, the exemplary embodiment shows only the simplified structure rather than the actual embodiment of the aforementioned zones.

Once the illumination of the photodiode ceases, the gate-to-source capacitor of the enhancement FET discharges through the drain-to-source path of the depletion FET and through the source terminal 15. The depletion FET is connected as a current source, so that the discharge current can be adjusted to a defined value.

The light-controllable semiconductor component described above can be used as a single semiconductor component. It can also be used in a photoelectric array, in which a plurality of the configurations described above are disposed in rows and columns in the form of a matrix in a semiconductor body.

FIG. 2 shows a fragmentary section through such an array. Identical elements or those functioning in the same way are provided with the same reference numerals as in FIG. 1. The photoelectric array differs from the configuration of FIG. 1 primarily in that the first zones 2 are constructed in strip form, as best seen in FIG. 3. A plurality of these strip-like first zones 2 are disposed parallel to one another. A plurality of units, each including one vertical FET, one depletion FET and one photosemiconductor component as described in conjunction with FIG. 1, are disposed in each of the strip-like zones 2. The zones 2 are suitably disposed on a substrate 20 that has a conductivity type opposite that of zone 2. The lower surface of the substrate 20 is contacted with a substrate electrode 21, which has a substrate terminal 22. The strip-like first zones 2 are each contacted with a drain terminal 23, which adjoins the zone 2 below the upper surface 16. The individual strip-like zones 2 are also suitably separated from one another by means of highly doped regions 25, which have the opposite conductivity type from zone 2.

FIG. 3 shows that the source terminals 15 of all of the units located in one row are connected to a row line 26. Likewise, each of the strip-like zones 2 is connected through its drain terminal 23 to a column line 24.

If one or more of the above-described units of the photoelectric array of FIGS. 2, 3 is then illuminated, a microprocessor, for instance, can ascertain which of the units are illuminated by sampling the column lines 24 and row the lines 26. This configuration enables recognition of characters or symbols of an illuminated pattern, that are disposed either in encoded form or in clear text.

Figure 4:
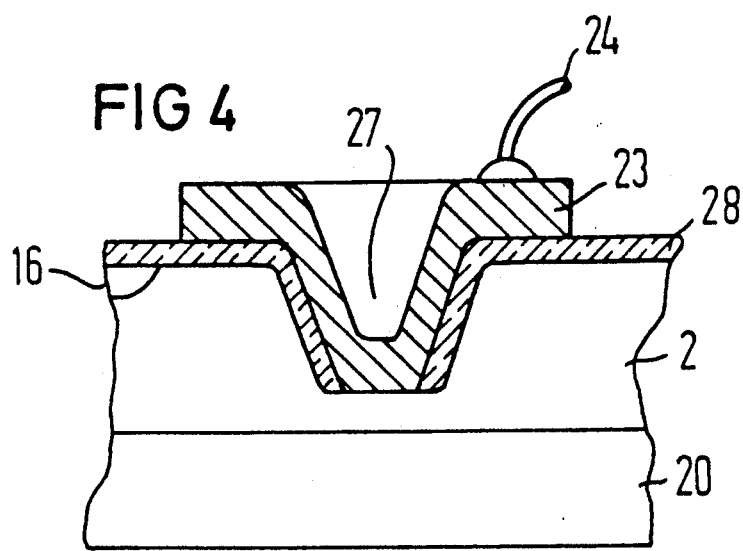
FIG. 4 is a fragmentary sectional view of a drain contact for the photoelectric array of FIG. 2.

FIG. 4 shows one possible type of embodiment of a drain terminal. The essential factor in this case is that the drain zone is contacted underneath the upper surface 16 of the semiconductor body, in order to maintain the high off-state capability of the vertical depletion FET. The drain terminal 23 contacts the zone 2 on the bottom of a contact hole 27 underneath the upper surface 16. The drain terminal is insulated from the wall of the contact hole and from the surface 16 by means of an insulating layer 28.

I claim:

1. Light-controllable semiconductor component, comprising:
   (a) a semiconductor body with an upper surface;
   (b) a first zone of a first conductivity type conterminous with said upper surface of said semiconductor body;
   (c) a first zone of a second conductivity type being embedded in said first zone of a first conductivity type and forming a gate zone of an enhancement FET;

(d) a second zone of the first conductivity type being embedded in said gate zone of said enhancement FET and forming a source zone of said enhancement FET;

(e) a second zone of the second conductivity type being embedded in said first zone of a first conductivity type and forming a light-sensitive region of a photosemiconductor component;

(f) said enhancement FET having a gate electrode electrically connected to said light-sensitive region;

(g) a third zone of the second conductivity type being embedded in said first zone;

(h) a depletion FET having a source zone, a drain zone and a gate zone embedded in said third zone of the second conductivity type;

(i) said depletion FET having a gate electrode electrically connected with said source zone of said depletion FET and with said source zone of said enhancement FET;

(j) said first zone of a first conductivity type forming a drain zone of said enhancement FET; and (k) a drain terminal being electrically connected to said drain zone of said enhancement FET and contacting said drain zone below said upper surface of said semiconductor body.

2. Light-controllable semiconductor element according to claim 1, including at least one other zone of a first conductivity type, at least one other vertical enhancement FET, at least one other depletion FET, and at least one other photosemiconductor element, a plurality of zones of a first conductivity type being disposed in said semiconductor body in the form of mutually parallel strips, a plurality of matrix-like units having row and column lines each including one vertical enhancement FET, one depletion FET and one photosemiconductor element being disposed in said plurality of zones of a first conductivity type, said source terminals of all of said vertical enhancement FETs being disposed in one of said rows and each being connected with a respective one of said row lines, said zones of a first conductivity type each being connected with a respective one of said column lines.

3. Light-controllable semiconductor component according to claim 2, including a substrate of a second conductivity type being connected to a fixed potential, said zones of a first conductivity type being disposed on said substrate.

4. Light-controllable semiconductor component according to claim 3, including regions of a second conductivity type separating said zones of a first conductivity type from each other.

5. Light-controllable semiconductor component according to claim 1, wherein said photosemiconductor component is a photodiode.

6. Light-controllable semiconductor component according to claim 1, wherein said photosemiconductor component is a phototransistor.

* * * * *